United States Patent
Simpson et al.

(10) Patent No.: US 12,463,155 B2
(45) Date of Patent: Nov. 4, 2025

(54) SEMICONDUCTOR DEVICE

(71) Applicants: DYNEX SEMICONDUCTOR LIMITED, Lincoln (GB); ZHUZHOU CRRC TIMES SEMICONDUCTOR CO. LTD, Zhuzhou (CN)

(72) Inventors: Robin Adam Simpson, Lincoln (GB); Yangang Wang, Lincoln (GB)

(73) Assignees: DYNEX SEMICONDUCTOR LIMITED, Lincoln (GB); ZHUZHOU CRRC TIMES SEMICONDUCTOR CO. LTD, Zhuzhou (CN)

( * ) Notice: Subject to any disclaimer, the term of this patent is extended or adjusted under 35 U.S.C. 154(b) by 71 days.

(21) Appl. No.: 18/010,619

(22) PCT Filed: Aug. 27, 2021

(86) PCT No.: PCT/EP2021/073805
§ 371 (c)(1),
(2) Date: Mar. 2, 2023

(87) PCT Pub. No.: WO2023/025402
PCT Pub. Date: Mar. 2, 2023

(65) Prior Publication Data
US 2024/0105645 A1 Mar. 28, 2024

(51) Int. Cl.
*H01L 23/62* (2006.01)
*H01L 23/00* (2006.01)
(Continued)

(52) U.S. Cl.
CPC ............ *H01L 23/62* (2013.01); *H01L 23/051* (2013.01); *H01L 23/562* (2013.01); *H01L 25/072* (2013.01)

(58) Field of Classification Search
CPC . H01L 2924/00014; H01L 2924/13055; H01L 2924/0002
See application file for complete search history.

(56) References Cited

U.S. PATENT DOCUMENTS

| 4,399,452 A | 8/1983 | Nakashima et al. |
| 4,567,504 A | 1/1986 | Egerbacher et al. |

(Continued)

FOREIGN PATENT DOCUMENTS

| CN | 112992866 A | 6/2021 | |
| EP | 3007220 A1 * | 4/2016 | ........... H01L 23/051 |

(Continued)

OTHER PUBLICATIONS

International Search Report and Written Opinion issued in connection with corresponding PCT Patent Application No. PCT/EP2021/073805 dated Apr. 12, 2022.

*Primary Examiner* — Brent A. Fairbanks
*Assistant Examiner* — Michael Anguiano
(74) *Attorney, Agent, or Firm* — Tarolli, Sundheim, Covell & Tummino LLP

(57) ABSTRACT

There is provided a semiconductor device 1, comprising: a housing comprising: a first housing electrode 4 and a second housing electrode 5 arranged at opposite sides of the housing, and a tubular housing element 8 arranged between the first and second housing electrodes 4, 5 and configured to electrically isolate the first and second housing electrodes 4, 5 from one another; at least one semiconductor chip 20 arranged within the housing between the first and second housing electrodes 4, 5; and a metal explosion shield 12 arranged within the housing, wherein the metal explosion shield 12 is configured to extend into a space formed between the at least one semiconductor chip 20 and the tubular housing element 8 such that the metal explosion shield surrounds the at least one semiconductor chip 20.

19 Claims, 4 Drawing Sheets

(51) Int. Cl.
*H01L 23/051* (2006.01)
*H01L 25/07* (2006.01)

(56) References Cited

U.S. PATENT DOCUMENTS

| | | | | |
|---|---|---|---|---|
| 9,818,705 | B1* | 11/2017 | Kuwahara | H01L 23/047 |
| 2008/0073767 | A1* | 3/2008 | Taguchi | H01L 23/051 |
| | | | | 257/E23.193 |
| 2010/0265744 | A1* | 10/2010 | Dorn | H05K 7/14325 |
| | | | | 257/712 |
| 2015/0206811 | A1* | 7/2015 | Miyake | H01L 23/051 |
| | | | | 438/117 |
| 2022/0336300 | A1* | 10/2022 | Ptakova | H01L 25/165 |

FOREIGN PATENT DOCUMENTS

| | | | |
|---|---|---|---|
| EP | 3252809 | A1 | 12/2017 |
| WO | 2016184590 | A1 | 11/2016 |

\* cited by examiner

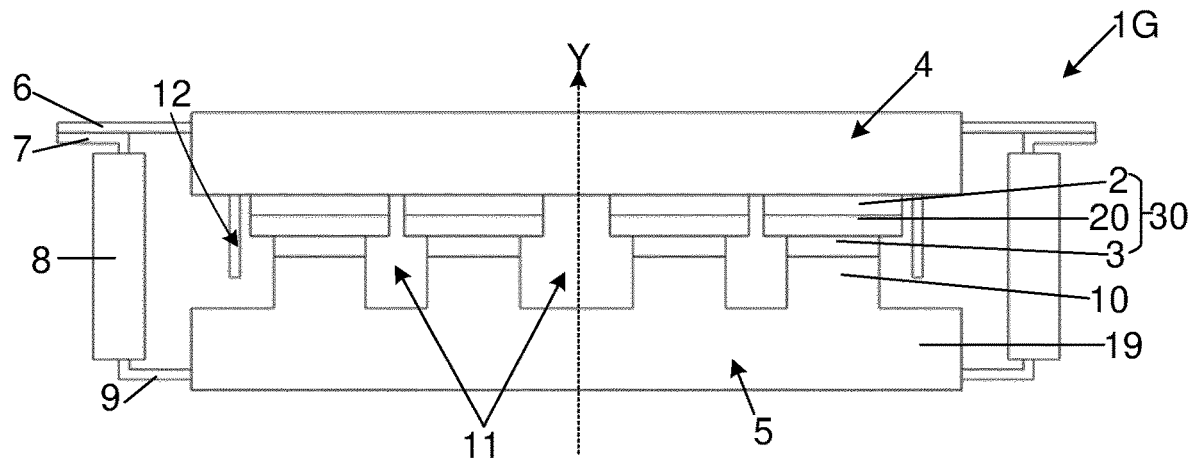

Figure 10

S1
Providing a housing, wherein the housing comprises a first housing electrode and a second housing electrode arranged at opposite sides of the housing, and a tubular housing element arranged between the first and second housing electrodes and configured to electrically isolate the first and second housing electrodes from one another S2
Arranging at least one semiconductor chip within the housing between the first and second housing electrodes S3
Arranging a metal explosion shield within the housing, wherein the metal explosion shield extends into a space formed between the at least one semiconductor chip and the tubular housing element such that the metal explosion shield surrounds the at least one semiconductor chip

Figure 11

SEMICONDUCTOR DEVICE

RELATED APPLICATIONS

The present invention is a U.S. National Stage under 35 USC 371 patent application, claiming priority to PCT Application No. PCT/EP2021/073805, filed on Aug. 27, 2021; the entirety of which is hereby incorporated herein by reference.

TECHNICAL FIELD

The present disclosure relates to a semiconductor device. More particularly, but not exclusively, the present disclosure relates to a power semiconductor device having an improved failure mode by arranging a metal explosion shield within its housing.

BACKGROUND

A power semiconductor device may house one or more power semiconductor chips (or dies). The power semiconductor chips are often used to switch high currents and voltages, and may include one or more of a power transistor, a power diode, and a thyristor, etc. A power transistor includes, but is not limited to, a power metal-oxide-semiconductor field effect transistor (MOSFET), a power bipolar junction transistor (BJT), and an insulated gate bipolar transistor (IGBT), etc. A thyristor includes, but is not limited to, an integrated gate-commutated thyristor (IGCT), and a gate turn-off thyristor (GTO), etc. The power semiconductor device may also be referred to as a power module or a power electronic module.

It is common for a power semiconductor device to have a hermetic package. The hermetic package provides a hermetically sealed housing (or case) which encloses an internal space, and one or more power semiconductor chips are arranged within the internal space of the housing. The hermetic package is often filled with an inert gas (e.g., nitrogen) to prevent moisture, dust particles and/or other foreign particles from entering the package, thereby ensuring normal operation of the chips. The terms "housing" and "case" are used interchangeably below.

FIG. 1 schematically illustrates a sectional view of a known power semiconductor device 100 which has a press-pack package. The press-pack package is typically a hermetic package. Press-pack power semiconductor devices are an alternative to traditional isolated-base power semiconductor devices, in which power semiconductor chips are typically soldered on isolated substrates that carry the chips respectively and are also wire-bonded to the substrates. Instead of the wire bonds and solder joints used in isolated-base devices, press-pack devices typically rely on the application of force by an external clamping system, to make contact to the chips.

As shown in FIG. 1, the press-pack power semiconductor device 100 comprises a plurality of semiconductor chips 120. Individual semiconductor chips 120 are connected in parallel within a single pressure contact housing to produce a single device containing multiple chips with a current handling capability that is ideally the sum of the capability of all the chips contained within the housing. The semiconductor chips 120 are placed between mechanical strain buffers 102, 103 to form semiconductor units 130. These semiconductor units 130 are then positioned between upper and lower electrodes 104, 105 in a hermetically-sealed housing which is formed by the electrodes 104, 105, a ceramic tube 108 and thin flanges 106, 107, 109. The thin flanges include a lid flange 106, a housing upper flange 107, and a housing lower flange 109. The thin flanges 106, 107, 109 make a gas-tight, flexible joint between the electrodes 104, 105 and the ceramic tube 108. The hermetically-sealed housing encloses an internal space 111. The internal space 111 is typically filled with nitrogen.

It is typical that one electrode (e.g., the upper electrode 104) is flat and the other (e.g., the lower electrode 105) has an array of pillars 110 formed on its inner surface. The semiconductor units 130 typically have upper and lower contact regions of differing areas. As shown in FIG. 1, the pillars 110 of the lower electrode 105 permit contact to the smaller area at the bottom surfaces of the chips 120.

Power semiconductor devices with hermetic cases are vulnerable to uncontrolled case ruptures in the event of excessive internal gas pressure. Internal gas pressure may be increased to critical levels by events such as a high energy discharge from local energy storage or continued operation in a state known as short-circuit failure mode.

High energy discharge may occur if a power semiconductor device fails and loses its ability to withstand high voltage. Commonly, power semiconductor devices are connected in circuits containing very large capacitors capable of storing tens of kilojoules of electrical energy to form an electrical system. During operation of the system, the voltage across the capacitors is maintained at a high level. This is enabled by the high voltage blocking capability of the devices. In the event of failure of a device, its high voltage blocking capability is lost and the energy from the capacitor(s) is discharged very rapidly in the form of a high electrical current, typically over the course of a few tens of microseconds. When a device (e.g., the device 100) fails, it does so initially at a single point (e.g., a single one of the chips 120). This point assumes a low impedance state relative to the rest of the device. Electrical current would follow the path of least resistance and therefore tends to flow through the failure point. In the event of a high energy discharge, the high current density at this point leads to rapid and excessive heating causing melting and thermal decomposition of adjacent components and the generation of high pressure within the internal space (e.g., the space 111) of the hermetically-sealed case. If the high pressure exceeds the pressure withstand capabilities of the case, then the case will rupture, often in an unpredictable manner.

In a system with in-built redundancy (i.e., the number of devices used exceeds the minimum required), if a failed device withstands the initial high energy discharge event, it is often required to operate in what is known as the short-circuit failure mode for an extended period of time, typically until the next scheduled maintenance of the system, which may occur at intervals of one year or more. In the short-circuit failure mode, the failed device must achieve and maintain a low impedance state approximating a short circuit to enable continued operation of the system as a whole. In this state, the load current for the system is typically conducted through a small area in the failed device, such as a single failed chip. This leads to the generation of high local temperatures within the case of the device. The high temperatures not only increase the pressure of gas (e.g., nitrogen) within the housing, but may also cause thermal decomposition of polymeric components, generating additional gases and further increasing internal pressure. If the internal gas pressure exceeds the withstand capability of the case, then, as for the high energy discharge event, the case may rupture in an unpredictable manner.

Case rupture of a power semiconductor device is hazardous for both neighbouring equipment and personnel due to emission of high temperature gases and ejection of debris including metals and ceramics, among other materials. One way to mitigate the danger caused by the case rupture of a power semiconductor device is to improve the rupture resistance of the case.

Known techniques involve the use of protective shield(s) within the case to obstruct the path of hot gases and explosion debris between the failure location and the inside surfaces of the ceramic tube 108 and the thin flanges 106, 107, 109. The protective shields are typically manufactured from insulating materials such as ceramics and polymers or a mixture thereof. DE 202015102948 U1, U.S. Pat. No. 4,399,452 A, JP S54-25165 A and WO 2016/184590 A1 disclose various examples of the protective shields. U.S. Pat. No. 4,567,504 also discloses the use of an insulating plastic foil to protect the ceramic tube of the case.

The materials of the protective shields are not ideal. In particular, protective shields made of polymers may help to prevent explosive case rupture up to some level of energy, but they may at the same time increase the level of pressure cumulated inside the case. This is because polymers will undergo thermal decomposition at the high temperatures experienced during the short-circuit failure mode, and the thermal decomposition increases the internal gas pressure inside the sealed case. Therefore, in case the overpressure exceeds a critical value, protective shields made of polymers only have limited effects.

Ceramic materials are typically brittle and are difficult to manufacture to precise dimensions by mass production techniques with acceptable costs. Therefore, protective shields made of ceramics typically require a wide dimensional tolerance. Further, the ceramic shields need to be relatively thick to resist fracture. Therefore, sufficient additional space is required in the housing to accommodate the ceramic shields.

It is an object of the present disclosure, among others, to provide a semiconductor device with an improved failure mode, which solves problems associated with known semiconductor devices, whether identified herein or otherwise.

SUMMARY

According to a first aspect of the present disclosure, there is provided a semiconductor device, comprising:
a housing comprising: a first housing electrode and a second housing electrode arranged at opposite sides of the housing, and a tubular housing element arranged between the first and second housing electrodes and configured to electrically isolate the first and second housing electrodes from one another;
at least one semiconductor chip arranged within the housing between the first and second housing electrodes; and
a metal explosion shield arranged within the housing, wherein the metal explosion shield is configured to extend into a space formed between the at least one semiconductor chip and the tubular housing element such that the metal explosion shield surrounds the at least one semiconductor chip.

By extending into a space formed between the at least one semiconductor chip and the tubular housing element so as to surround the at least one semiconductor chip, the metal explosion shield is able to block pathways of hot gases and explosion debris between a failure location in the at least one semiconductor chip and an inner surface of the tubular housing element. Therefore, the metal explosion shield is useful for protecting the tubular housing element from destruction resulting from a force produced by an explosion of the at least one semiconductor chip.

The metal explosion shield, as the name suggests, is made of metal material(s). The use of metal material(s) ensures that the metal explosion shield would not thermally decompose and contribute to the increase in internal gas pressure observed during operation in the short-circuit failure mode of the semiconductor device. Further, due to the strength and ductility of metal material(s), the metal explosion shield can be made thinner than plastic or ceramic shields of equivalent robustness, consuming less of the internal volume of the housing and allowing more room for the expansion of gases within the housing during the failure mode. Therefore, the metal explosion shield is also useful for reducing the risk of explosive rupturing of the housing.

Therefore, with the metal explosion shield, the semiconductor device has an improved failure mode and a higher reliability.

The at least one semiconductor chip may comprise first and second opposing surfaces, which face the first and second housing electrodes, respectively. The metal explosion shield may be configured to extend beyond each of the first surface and the second surface.

By extending beyond each of the first surface and the second surface, the metal explosion shield is able to block the majority (if not all) of possible pathways of hot gases and explosion debris between a failure location in the at least one semiconductor chip and an inner surface of the tubular housing element. Therefore, the metal explosion shield can effectively protect the tubular housing element from destruction.

The metal explosion shield may be spaced apart from the at least one semiconductor chip.

The metal explosion shield may comprise a metal tube. The metal tube may extend along an axial direction of the housing.

The metal explosion shield may further comprise a lip attached to a free end of the metal tube. The lip may extend radially inwards from the free end of the metal tube.

It would be understood that the "free end" of the metal tube refers to an unconstrained end which is not fixedly connected to any other structure of the semiconductor device.

The semiconductor device may further comprise a dielectric coating which coats the metal explosion shield.

The metal explosion shield may comprise first and second opposite ends. The first end may be a fixed end which is electrically coupled to the first housing electrode. The second end may be a free end which is spaced apart from the second housing electrode.

Since the second end is spaced apart from the second housing electrode, the metal explosion shield would not create an unintended electrical short path between the first and second housing electrodes.

It would be understood that the "fixed end" of the metal explosion shield refers to a constrained end which is fixedly connected to another structure of the semiconductor device, and that the "free end" of the metal explosion shield refers to an unconstrained end which is not fixedly connected to any other structure of the semiconductor device.

The first and second opposite ends may be arranged along an axial direction of the housing.

The metal explosion shield may be fixedly connected to the first housing electrode.

The housing may further comprise a first flange connecting the first housing electrode with the tubular housing element, and a second flange connecting the second housing electrode with the tubular housing element.

The metal explosion shield may be fixedly connected to the first flange.

The semiconductor device may further comprise an electrically conductive structure arranged between the at least one semiconductor chip and the first housing electrode. The electrically conductive structure may be electrically coupled to the first housing electrode and the at least one semiconductor chip.

The electrically conductive structure may be electrically coupled to the first housing electrode by pressure. Further or alternatively, the electrically conductive structure may be electrically coupled to the at least one semiconductor chip by pressure.

The metal explosion shield may be fixedly connected to the electrically conductive structure.

The electrically conductive structure may comprise a metal plate arranged between the at least one semiconductor chip and the first housing electrode, and at least one first pillar extending between the metal plate and the at least one semiconductor chip.

The metal explosion shield may be fixedly connected to the metal plate.

The electrically conductive structure may further comprise at least one second pillar extending between the first housing electrode and the metal plate.

The metal explosion shield may be referred to as a first metal explosion shield. The semiconductor device may further comprise a second metal explosion shield arranged within the housing and spaced apart from the first metal explosion shield.

The second metal explosion shield may comprise a metal tube. The metal tube may extend along an axial direction of the housing.

The second metal explosion shield may have a greater cross-sectional dimension than the first metal explosion shield along a plane which is perpendicular to an axial direction of the housing.

The first and second metal explosion shields may be concentric.

The first and second metal explosion shields may extend along opposite directions.

The second metal explosion shield may overlap with the first metal explosion shield along an axial direction of the housing.

The expression "the second metal explosion shield overlaps with the first metal explosion shield along an axial direction of the housing" means that when the first and second metal explosion shields are projected into the axial direction of the housing, their projections overlap. Therefore, the first and/or second metal explosion shields may extend along a direction which is different from the axial direction of the housing.

The second metal explosion shield may comprise third and fourth opposite ends. The third end may be a fixed end which is electrically coupled to the second housing electrode, and the fourth end may be a free end which is spaced apart from the first housing electrode.

The semiconductor device may further comprise a third metal explosion shield spaced apart from the second metal explosion shield. The third metal explosion shield may have a greater cross-sectional dimension than the second metal explosion shield along a plane which is perpendicular to an axial direction of the housing.

The first, second and third metal explosion shields may be concentric.

The housing may be hermetic.

The at least one semiconductor chip may be electrically and thermally coupled to each of the first and second housing electrodes.

The at least one semiconductor chip may be coupled to at least one of the first and second housing electrodes by pressure.

The semiconductor device may further comprise a first strain buffer arranged between the at least one semiconductor chip and the first housing electrode.

The semiconductor device may further comprise a second strain buffer arranged between the at least one semiconductor chip and the second housing electrode.

The (first) metal explosion shield may be configured to extend beyond one or more of the first strain buffer and the second strain buffer.

The semiconductor device may be a power semiconductor device, and the at least one semiconductor chip may comprise at least one power semiconductor chip.

According to a second aspect of the present disclosure, there is provided a method of manufacturing a semiconductor device, comprising:

providing a housing, wherein the housing comprises a first housing electrode and a second housing electrode arranged at opposite sides of the housing, and a tubular housing element arranged between the first and second housing electrodes and configured to electrically isolate the first and second housing electrodes from one another;

arranging at least one semiconductor chip within the housing between the first and second housing electrodes; ad arranging a metal explosion shield within the housing, wherein the metal explosion shield extends into a space formed between the at least one semiconductor chip and the tubular housing element such that the metal explosion shield surrounds the at least one semiconductor chip.

Where appropriate any of the optional features described above in relation to the first aspect of the present disclosure may be applied to the second aspect of the disclosure. The expression "integrally formed" used in the present disclosure means that integrally formed elements are connected together so as to make up a single complete piece or unit, and so as to be incapable of being easily dismantled without destroying the integrity of the piece or unit.

The term "fixedly connected" used in the present disclosure means that the connected elements may be integrally formed or, alternatively, may be securely bonded together (e.g., by a soldering, sintering or brazing process).

The terms "electrically coupled" and "thermally coupled" used in the present disclosure means that one or more intervening elements may be connected between the coupled elements.

It would also be understood that the terms "first", "second", "third" and "fourth" are simply used in the present disclosure to label the relevant elements (e.g., "housing electrodes", "metal explosion shield" and "end" etc.) for the ease of description, and do not imply any limitations to the sequence or locations of the relevant elements.

BRIEF DESCRIPTION OF THE DRAWINGS

In order that the disclosure may be more fully understood, a number of embodiments of the disclosure will now be described, by way of example, with reference to the accompanying drawings, in which:

FIG. 10 is a schematic representation of a semiconductor device according to an eighth embodiment of the present disclosure.

FIG. 11 schematically illustrates processing steps of a method for manufacturing a semiconductor device;

In the figures, like parts are denoted by like reference numerals.

It will be appreciated that the drawings are for illustration purposes only and are not drawn to scale.

DETAILED DESCRIPTION OF THE PREFERRED EMBODIMENTS

Figure 1:
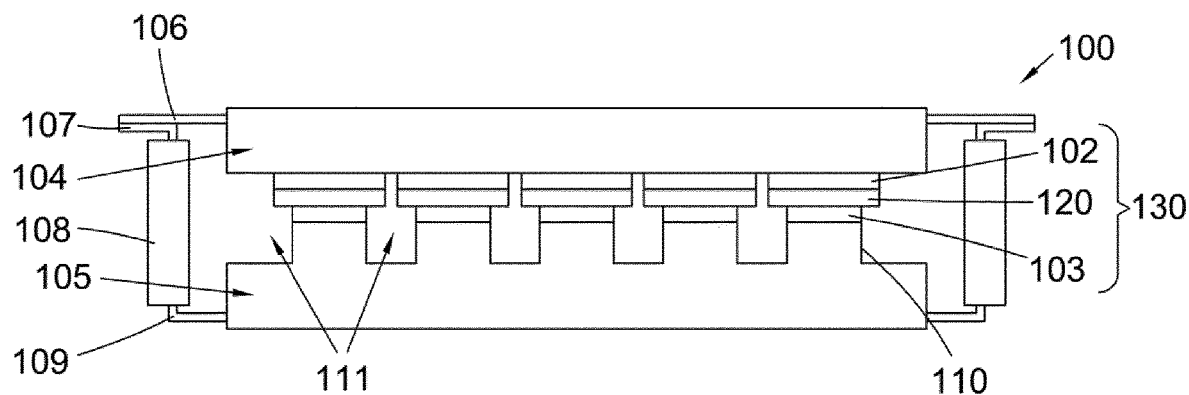
FIG. 1 is a schematic representation of a known semiconductor device.
Figure 2:
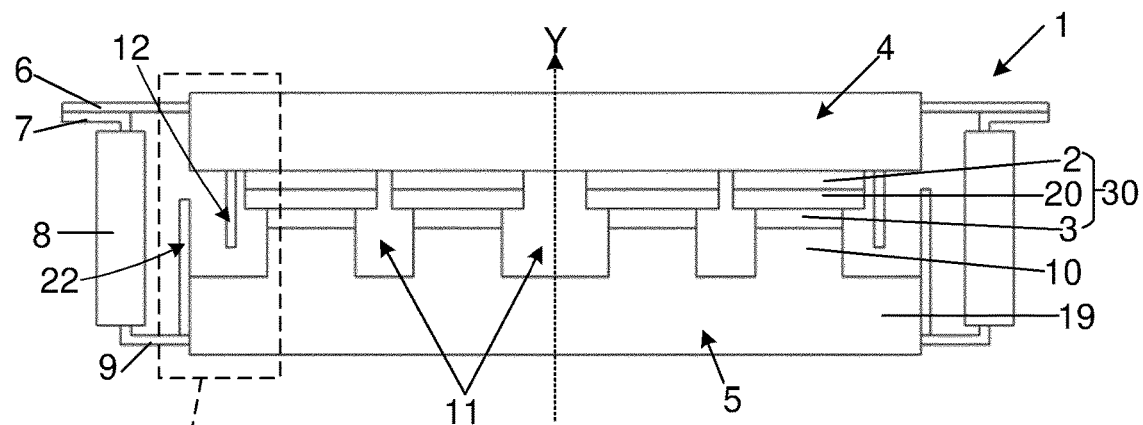
FIG. 2 is a schematic representation of a semiconductor device according to a first embodiment of the present disclosure.

FIG. 2 schematically illustrates a cross sectional view of a semiconductor device 1 (referred to as the "device" below) according to a first embodiment of the present disclosure. In this example, the semiconductor device 1 is embodied as a multi-chip press-pack power semiconductor device.

As shown in FIG. 2, the device 1 comprises an upper electrode 4, a lower electrode 5, upper strain buffers 2, lower strain buffers 3, and a plurality of power semiconductor chips 20 (referred to as the "chips" below). The upper strain buffers 2 and the lower strain buffers 3 are arranged at opposite surfaces of the chips 20. The upper and lower electrodes 4, 5 are typically made of copper. The upper strain buffers 3 and the lower strain buffers 4 are typically made of molybdenum. The power semiconductor chips 20 may be made in silicon technology, or alternatively may be based upon other types of semiconductors, such as, silicon carbide, gallium nitride, or silicon germanium etc. The chips 20 may comprise one or more of a power transistor (e.g., an IGBT, a power MOSFET, a power BJT), a power diode, and a power thyristor (e.g., an IGCT, a GTO) etc.

During normal operation of the device 1, the device 1 heats and cools, and consequently each component of the device 1 undergoes thermal expansion and contraction. Difference in the thermal expansion coefficients of adjacent components leads to abrasive wear (also called "fretting") of their contact surfaces. The thermal expansion coefficients of silicon and molybdenum are more closely matched than those of silicon and copper. The strain buffers 2, 3 are useful for reducing the rate of wear on the surfaces of the chips 20.

The chips 20 may be silver sintered (or otherwise bonded) to the strain buffers 2, 3 to further reduce the risks of fretting and reduce the thermal resistance of the chips 20. A combination of an individual chip 20 with its associated strain buffers 2, 3 may be referred to as a semiconductor unit 30. It would, however, be appreciated that the strain buffers 2, 3 may be wholly or partly omitted from the semiconductor units 30. As shown by FIG. 2, the semiconductor units 30 are laterally spaced to one another. The semiconductor units 30 are electrically connected in parallel between the upper electrode 4 and the lower electrode 5. Therefore, the overall current rating of the device 1 is generally determined by the number of semiconductor units 30 paralleled inside the device 1 and the current rating of each semiconductor unit 30.

The device 1 further includes a lid flange 6, a housing upper flange 7, a tubular housing element 8, and a housing lower flange 9. These components form a gas-tight (or hermetic) connection between the upper electrode 4 and the lower electrode 5. The tubular housing element 8 is of a tubular shape and surrounds the semiconductor units 30. When viewed from the top of FIG. 2, the cross section of the tubular housing element 8 is typically square or circular but may take any suitable shape. The tubular housing element 8 extends between the upper and lower electrodes 4, 5. The housing lower flange 9 connects the lower electrode 5 with the tubular housing element 8. The lid flange 6 and the housing upper flange 7 connect the upper electrode 4 with the tubular housing element 8. Each of the flanges 6, 7, 9 is loop shaped and generally follows the shape of the tubular housing element 8.

The electrodes 4, 5 and the flanges 6, 7, 9 as well as the tubular housing element 8 together form a hermetic housing of the device 1. An axial direction of the housing is illustrated and labelled as "Y" in FIG. 2. The Y axial direction is typically coincident with a central axis of the tubular housing element 8. The semiconductor units 30 are located within the housing between the upper and lower electrodes 4, 5. The upper electrode 4 and the lower electrode 5 may also be referred to as housing electrodes. One of the upper electrode 4 and the lower electrode 5 may be referred to as a "first housing electrode", with the other being referred to as a "second housing electrode". Accordingly, the flange(s) (e.g., the housing lower flange 9, or a combination of the lid flange 6 and the housing upper flange 7) connecting the "first housing electrode" with the tubular housing element 8 may be referred to as "a first flange", and the flange(s) (e.g., a combination of the lid flange 6 and the housing upper flange 7, or the housing lower flange 9) connecting the "second housing electrode" with the tubular housing element 8 may be referred to as "a second flange".

The tubular housing element 8 comprises an electrically insulating material (e.g., ceramic) and electrically isolates the upper electrode 4 from the lower electrode 5. It would be appreciated that the tubular housing element 8 may further comprise electrically conductive material(s) so far as the electrically conductive material(s) do not form a conducting path between the electrodes 4, 5. The flanges 6, 7, and 9 may be made of copper or nickel-iron.

The housing encloses an internal space 11 which is typically filled with an inert gas (e.g., nitrogen) at a suitable pressure (e.g., approximately one standard atmospheric pressure) to ensure reliable operation of the chips 20. While FIG. 2 shows that the internal space 11 includes separate sections located at opposite sides of each semiconductor unit 30, it would be understood that the separate sections are in fact interconnected in the third dimension relative to the cross-sectional plane of FIG. 2.

The lower electrode 5 further comprises an electrode plate 19 integrally formed with an array of pillars 10. The electrode plate 19 has generally flat inner and outer surfaces. In the present disclosure, the expression "inner surface" of a housing component refers to a surface that faces the semiconductor units 30, and the expression "outer surface" of a housing element refers to a surface that is exposed to an exterior of the device 1. The array of pillars 10 extend between the inner surface of the electrode plate 19 and the lower surfaces of the semiconductor units 30. The semiconductor units 30 typically have upper and lower contact regions of differing areas. In the example of FIG. 2, the sizes of the upper contact regions are greater than those of the lower contact regions. The pillars 10 form contacts with the lower contact regions of the semiconductor units 30.

Dry interfaces may exist between the semiconductor units 30 and the upper electrode 4, and/or between the semiconductor units 30 and the pillars 10. A dry interface means that elements at opposite sides of the interface are coupled by pressure, and there is no bonding material between the elements. By clamping the semiconductor units 30 between the electrodes 4, 5, the chips 20 are electrically and thermally coupled to the electrodes 4, 5. In particular, upper sides of the chips 20 are electrically and thermally coupled to the upper electrode 4. Lower sides of the chips 20 are electrically and thermally coupled to the lower electrode 5.

The device 1 further comprises a first metal explosion shield 12 and a second metal explosion shield 22 arranged inside the housing. Each of the metal explosion shields 12, 22 takes the form of a metal tube. The central axis of the metal tube may be parallel to the Y axis. The metal explosion shields 12, 22 are made of metal material(s), which are generally compatible with the material(s) of the electrodes 4, 5. In an example, the metal explosion shields 12, 22 are made of copper or nickel-iron. When viewed along the Y axis, the cross-sectional shapes of the metal explosion shields 12, 22 may follow the shape of the tubular housing element 8 (which is typically circular or square as described above) although it would be understood that the metal explosion shields 12, 22 may have a different cross-sectional shape from the tubular housing element 8. Further, the second metal explosion shield 22 has a greater cross sectional dimension than the first metal explosion shield 12, along a plane (not labelled in FIG. 2) which is perpendicular to the Y axis. Preferably, the metal explosion shields 12, 22 are concentric. Further, the shields 12, 22 and the tubular housing element 8 may also be concentric.

As shown in FIG. 2, the first metal explosion shield 12 is attached to an inner surface of the upper electrode 4, and extends downwards (along a direction parallel to the Y axis) into a space formed between the semiconductor units 30 and the tubular housing element 8 such that it surrounds the semiconductor units 30. In particular, the free end (e.g., the lower end) of the first metal explosion shield 12 extends beyond the lower surfaces of the semiconductor units 30. The upper end of the first metal explosion shield 12 lies flush with the upper surfaces of the semiconductor units 30. Therefore, the first metal explosion shield 12 surrounds the full height (along the Y axis) of the semiconductor units 30.

As shown in the inset of FIG. 2, the first metal explosion shield 12 is spaced apart from the nearby semiconductor units 30 along a plane which is perpendicular to the Y axis. The free end of the first metal explosion shield 12 is further spaced apart from the inner surface of the electrode plate 19, by a clearance L1 when measured along the Y axis. Since the first metal explosion shield 12 is electrically connected to the upper electrode 4, the clearance L1 ensures that the first metal explosion shield 12 is not electrically connected to the lower electrode 5, considering that the gas (e.g., nitrogen) filled into the internal space 11 is typically a dielectric gas. In this way, the first metal explosion shield 12 would not form an unintended electrically conductive short path between the electrodes 4, 5 which would cause the device 1 to malfunction.

With further reference to FIG. 2, the second metal explosion shield 22 may be attached to an inner surface of the housing lower flange 9, and/or a peripheral edge of the electrode plate 19. Either way, the second metal explosion shield 22 is electrically connected to the lower electrode 5. The second metal explosion shield 22 extends upwards (along a direction parallel to the Y axis) and overlaps a part of the first metal explosion shield 12. Therefore, in the example of FIG. 2, the shields 12, 22 extend along opposite directions. The overlapping portions of the shields 12, 22 have a length L3 when measured along the Y axis.

The second metal explosion shield 22 is further spaced apart from the first metal explosion shield 12, by a clearance W1 when measured along a plane perpendicular to the Y axis. Further, the free end (e.g., the upper end) of the second metal explosion shield 22 is spaced apart from the inner surface of the upper electrode 4, by a clearance L2 when measured along the Y axis. The clearances W1, L2 ensure that the second metal explosion shield 22 is not electrically connected to the first metal explosion shield 12 or the upper electrode 4. As a result, neither the second metal explosion shield 22 alone nor a combination of the shields 12, 22 would electrically short the electrodes 4, 5 together.

The minimum value of L1, W1 or L2 generally depends on the voltage rating of the semiconductor chips 20 and the internal atmosphere of the device 1. The breakdown voltage of air is typically 3 kV/mm at 1 atmosphere, and the breakdown voltage of nitrogen gas is typically 3.45 kV/mm at 1 atmosphere. In an example, if the voltage rating of the semiconductor chips 20 is 3 kV (meaning that the voltage difference between the upper electrode 4 and the lower electrode 5 is expected to be of the order of 3 kV) and the housing of the device 1 is filled with nitrogen, the minimum value of L1, W1 or L2 would be at least approximately 0.87 mm (=3 kV/3.45 kV/mm). When L1, W1 or L2 is less than the minimum value, the electric field across the clearance may exceed the dielectric strength of nitrogen, causing the nitrogen gas to partially ionize and to begin conducting, thereby creating a short path between the electrodes 4, 5.

In practice, a clearance in excess of the voltage rating of the chips 20 divided by 3 kV/mm may be used, but the electric field concentration at the edges of the shields 12, 22 also needs to be considered. This is because breakdown is a local process, and begins at point(s) where the electric field first exceeds the local dielectric strength of nitrogen. Typically speaking, the electric field at the surface of a conductor is highest at protruding parts, sharp points and edges. Therefore, the breakdown of gas usually starts at the edges and/or corners of the shields 12, 22. Accordingly, the minimum value of L1, W1 or L2 may be set slightly higher than the value calculated using the voltage rating and the breakdown voltage of the gas.

Figure 3:
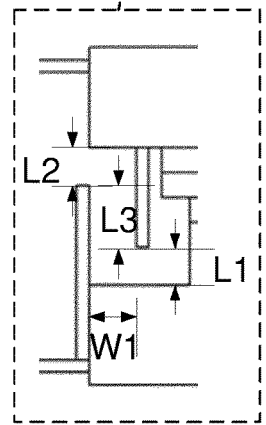
FIG. 3 is a partial view of the semiconductor device of FIG. 2 during a failure mode.
Figure 3:
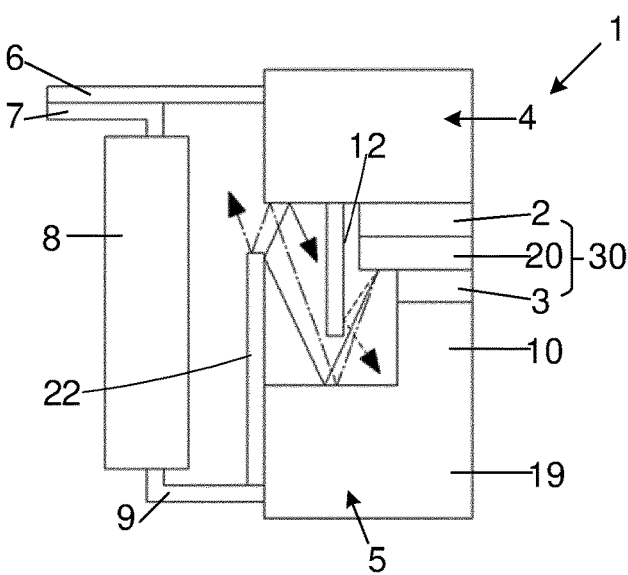

As shown in the inset of FIG. 2, the sum of L1, L2 and L3 is equal to the distance between the upper and lower electrodes 4, 5. It is preferable to minimise L1, L2 (while still meeting the requirement for electrical isolation between the electrodes 4, 5 as described above) and to maximise the vertical overlap L3 between the shields 12, 22. FIG. 3 illustrates exemplary pathways of pressure waves and debris ejected from the outmost chip 20 in a failure mode of the device 1. As shown in FIG. 3, the pressure waves and debris would be reflected by the shields 12, 22 as well as the inner surfaces of the electrodes 4, 5. The overlapping arrangement of the shields 12, 22 in the vertical direction can obstruct any direct, line-of-sight path between a potential failure site at the chips 20, on the one hand, and the inner surface of the housing flanges 6, 7, 9 and the tubular housing element 8, on the other hand. By maximising the lengths of the shields 12, 22 as well as maximising the vertical overlap L3, the shields 12, 22 are able to reflect the pressure waves and debris as much as possible. Thus, the effects of the shields 12, 22 in obstructing pressure waves and debris ejected from an energy discharge at the semiconductor chips 20 are also maximised.

Further, while the first metal explosion shield 12 is spaced apart from the nearby semiconductor units 30 along a plane which is perpendicular to the Y axis, it is preferable that the diameter of the shield 12 is as small as possible, such that the shield 12 stays in close proximity to the outermost chips 20. This arrangement maximises the amount of energy reflected by the first metal explosion shield 12 back towards the centre of the housing, as the potential reflection angles for the pressure wave to enter into the space between the shields 12, 22 are significantly limited.

It is also desirable that the radial gap W1 between the shields 12, 22 is as small as possible (while still meeting the requirement for electrical isolation between the shields 12, 22 as described above). A small radial gap W1 is useful for reducing the amount of reflected pressure waves that escape from the boundary of the outer shield 22.

In the event of a fault, hot molten debris of exploded semiconductor chips 20 (formed of, for example, silicon) may scatter with high pressure. The overlapping metal explosion shields 12, 22 obstruct the pathways of the explosively scattering debris and pressure waves ejected by the explosion, and save the tubular housing element 8 as well as the flanges 6, 7 and 9 from the direct impingement of the debris and the pressure waves. In this way, the overlapping metal explosion shields 12, 22 are useful for protecting all inner surfaces of the housing (including the inner surface of the tubular housing element 8 as well as the inner surfaces of the flanges 6, 7, 9) from destruction resulting from the forceful explosive scattering of the molten chips 20.

Because the metal explosion shields 12, 22 are made of metal material(s) instead of polymers, the shields 12, 22 would not thermally decompose under high temperatures, and thus would not contribute to the increase in internal gas pressure observed during operation in the short-circuit failure mode.

Further, due to the strength and ductility of metal material(s), the metal explosion shields 12, 22 can be made thinner than plastic or ceramic components of equivalent robustness, consuming less of the internal volume of the housing, allowing more room for the expansion of gases within the housing.

Users of a press-pack power semiconductor device generally desire improved case rupture resistance in the event of a failure of the device. Typical solutions use plastic or silicone shields to protect the inside surfaces of the housing from the thermal and mechanical shock generated by discharge of a system's stored energy into a failed device. Such shields may protect against this initial shock, but will then begin to thermally decompose as the device is operated in its short-circuit failure mode, increasing the internal gas pressure within the housing, which can then lead to uncontrolled rupture if the pressure withstand capability of the housing is exceeded. This can be avoided if ceramic shields are used, but achieving satisfactory dimensional accuracy in ceramic components at an acceptable cost is not feasible. In contrast, the device 1 provides protection for the internal surfaces of the housing by using metal explosion shields 12, 22 that would not thermally decompose, therefore limiting internal gas pressure increase in the short-circuit failure mode. The metal explosion shields 12, 22 can also be manufactured with high dimensional accuracy at low cost.

While FIG. 2 shows that the free end (e.g., the lower end) of the first metal explosion shield 12 extends beyond the lower surfaces of the semiconductor units 30, it would be understood that in the event where the pillars 10 are omitted or the lower buffers 3 are not provided, the free end of the first metal explosion shield 12 may merely extend beyond the lower surfaces of the chips 20. In that way, the first metal explosion shield 12 would still be useful for reflecting a substantial amount of energy back towards the centre of the housing.

Further, while FIG. 2 shows that the sidewall of each shield 12 or 22 is a straight wall extending along the Y axis, it would be appreciated that at least a part of the sidewall may have a curved contour which deviates from the Y axis. The curved contour may be designed to reinforce the mechanical strength of the shields 12, 22.

It would also be understood that one or more of the shields 12, 22 may extend along a direction which forms a small angle with the Y axis, such that the respective shield has a frustoconical shape. Further, FIG. 2 shows that each of the shields 12, 22 has a uniform diameter along the Y axis. It would be appreciated that this arrangement is not necessary, and that one or more of the shields 12, 22 may have a varying diameter.

Preferably, the shields 12, 22 and the tubular housing element 8 are concentric. The concentric arrangement is beneficial in that it allows the shields 12, 22 to function uniformly in all radial directions, but may be modified based upon specific requirement of the device 1.

The device 1 may further comprise a circuit board (not shown in FIG. 2) which is supported by the inner surface of the electrode plate 19. The circuit board may comprise a printed circuit board (PCB) and at least one electrical circuit mounted on the PCB for controlling the operation of the chips 20. Electrical connectors (such as spring loaded pins) are generally used to electrically connect the circuit(s) on the circuit board to electrode pads of the chips 20. For example, if the chips 20 are IGBTs, the circuit board may comprise a driver circuit which generates a gate voltage, and the electrical connectors may connect the gate pad of each chip 20 to an output pad on the circuit board. It would be appreciated that the circuit board and the electrical connectors may be omitted for certain types of chips 20 (e.g., power diodes). A signal wire (not shown in FIG. 2) having one end electrically connected to the circuit board may pass through the shields 12, 22 and the housing of the device 1 and connect to a control terminal external to the device 1. The signal wire may bypass the second metal explosion shield 22 by extending into the radial space formed between the shields 12, 22 and then extending over the free end of the second metal explosion shield 22. Alternatively, the second metal explosion shield 22 may comprise a hole or slit for the signal wire to pass through. Similarly, the first metal explosion shield 12 may also comprise slits or holes to allow additional elements to pass through itself.

The device 1 may be assembled according to a sequence as follows. Firstly, the lower electrode 5 may be provided, followed by securely bonding (e.g., using a brazing, soldering or sintering process) the housing lower flange 9, the tubular housing element 8, and the second metal explosion shield 22 to lower electrode 5. Subsequently, the semiconductor units 30 are then placed on top of the pillars 10. While it is not shown in FIG. 2, a semiconductor unit locator which is typically made of a high temperature plastic may be used to hold the semiconductor units 30 in place. Next, an assembly of the upper electrode 4 and the first metal explosion shield 12 are provided on top of the semiconductor units 30. It follows that the housing upper flange 7 and the lid flange 6 are provided to seal the housing of the device 1. It would be appreciated that the process described above is merely an example of assembling the device 1, and is in no way limiting.

FIGS. 4 to 10 schematically illustrate cross-sectional views of semiconductor devices 1A to 1G according to second to eighth embodiments of the present disclosure. Elements of the devices 1A-1G that are identical to those of the device 1 are identified using the same labels. Elements of the devices 1A-1G that correspond to, but are different from those of the device 1 are labelled using the same numerals but with letters 'A' to 'G' for differentiation. The features and advantages described above with reference to the first embodiment are generally applicable to the second to eighth embodiments.

Figure 4:
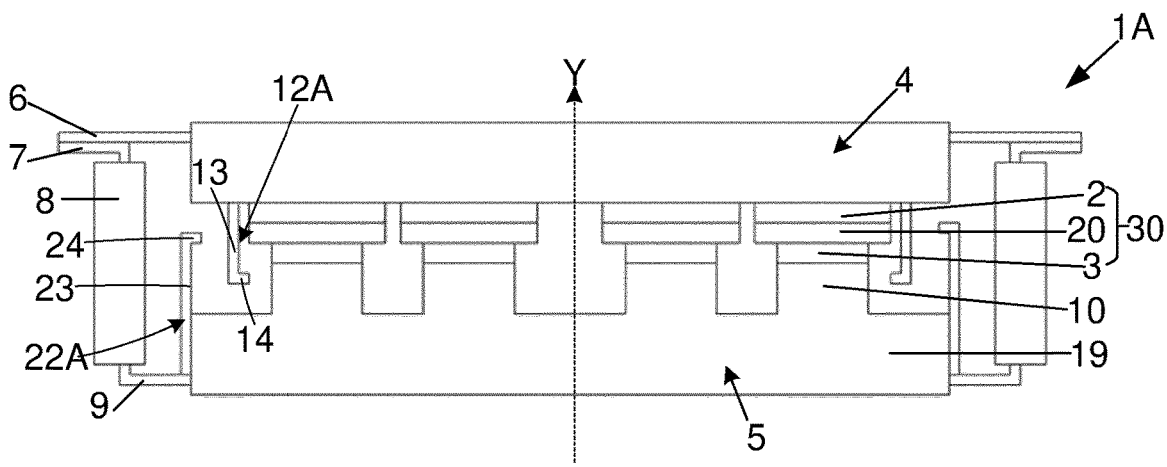
FIG. 4 is a schematic representation of a semiconductor device according to a second embodiment of the present disclosure.

With reference to FIG. 4, the device 1A differs from the device 1 in that horizontal lips are added to the metal explosion shields. In particular, the device 1A comprises a first metal explosion shield 12A and a second metal explosion shield 22A. The first metal explosion shield 12A comprises a metal tube 13 which is similar to the shield 12 of the device 1, and a lip 14 attached to a free end (e.g., the lower end) of the metal tube 13.

The lip 14 extends radially inwards from the free end of the metal tube 13. The second metal explosion shield 22A comprises a metal tube 23 which is similar to the shield 22 of the device 1, and a lip 24 attached to a free end (e.g., the upper end) of the metal tube 23. The lip 24 extends radially inwards from the free end of the metal tube 23. The lips 14 and 24 generally extend along a plane which is perpendicular to the Y axis, and have a beneficial effect on the reflection of pressure waves and debris. In particular, the lip 14 is able to reflect some of the pressure waves and debris ejected by the chips 20 (which may otherwise escape from the boundary of the shield 12A) back to the centre of the housing. The lip 24 is able to reflect some of the pressure waves and debris ejected by the chips 20 (which may otherwise escape from the boundary of the outer shield 22A) back to the radial gap between the shields 12A, 22A. The lips 14, 24 may be similarly applied to other embodiments of the semiconductor device, whether described herein or not.

Figure 5:
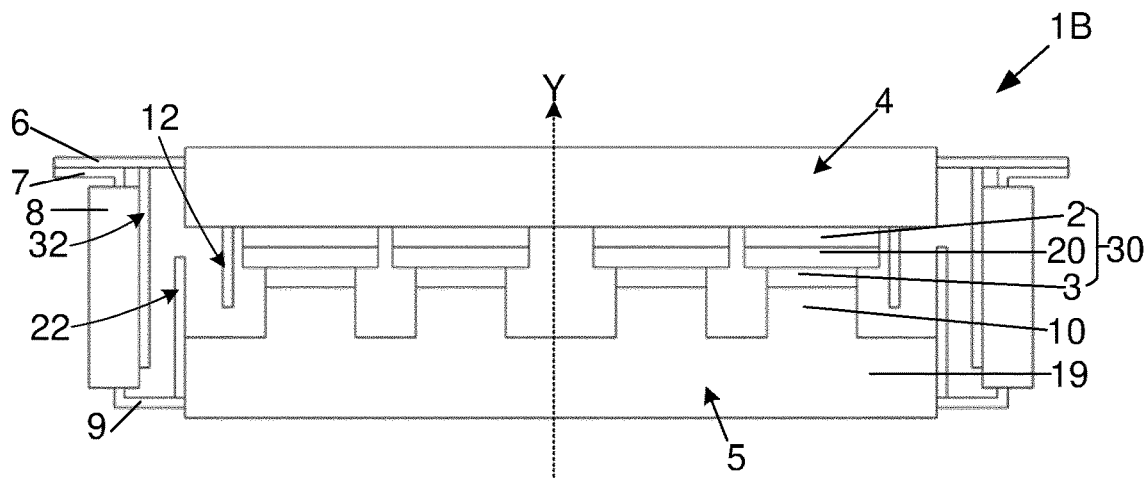
FIG. 5 is a schematic representation of a semiconductor device according to a third embodiment of the present disclosure.

With reference to FIG. 5, the device 1B differs from the device 1 in that the device 1B comprises a third metal explosion shield 32. Similar to the first metal explosion shield 12, the third metal explosion shield 32 takes the form of a metal tube which has a central axis generally parallel to the Y axis. An upper end of the third metal explosion shield 32 is securely attached to the lid flange 6. The free, lower, end of the third metal explosion shield 32 is spaced apart from the inner surface of the housing lower flange 9. The clearance between the third metal explosion shield 32 and the housing lower flange 9 ensures that the third metal explosion shield 32 would not form an electrically conductive short path between the electrodes 4, 5, and is generally determined in a way similar to the clearance L1 of FIG. 2. The third metal explosion shield 32 overlaps with the second metal explosion shield 22 along the Y axis, and has a greater cross sectional dimension than the second metal explosion shield 22. Preferably, the metal explosion shields 22, 32 are concentric. The third metal explosion shield 32 may be made of copper or nickel-iron. As shown in FIG. 5, the third metal explosion shield 32 is in close proximity to or in contact with the tubular housing element 8, and covers the majority of the inner surface of the tubular housing element 8. Therefore, the third metal explosion shield 32 saves the tubular housing element 8 from direct impingement of debris and pressure waves which escape from the second metal explosion shield 22. It may be desirable to use the third metal explosion shield 32 when additional room can be spared within the housing. The third metal explosion shield 32 may be similarly applied to other embodiments of the semiconductor device, whether described herein or not.

Figure 6:
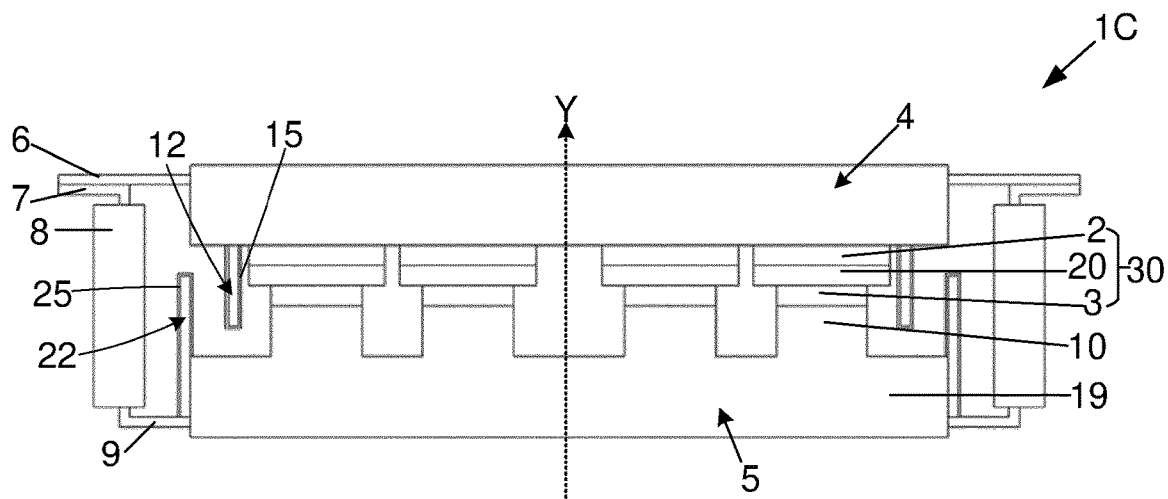
FIG. 6 is a schematic representation of a semiconductor device according to a fourth embodiment of the present disclosure.

With reference to FIG. 6, the device 1C differs from the device 1 in that in the device 1C, the first and second metal explosion shields 12, 22 are coated with dielectric coatings 15, 25, respectively. The dielectric coatings 15, 25 may be made of silicone, and allow for closer positioning of the shields 12, 22 between themselves, and closer positioning of the shields with respect to the electrodes 4, 5. In other words, the dielectric coatings 15, 25 improve the electrical isolation between the shield 12 and the lower electrode 5, between the shield 22 and the upper electrode 4 as well as between the shields 12, 22. Therefore, the clearances L1 and L2 as well as the radial gap W1 of FIG. 2 may be reduced without negatively impact the electrical isolation between the electrodes 4, 5. The dielectric coatings 15, 25 may be similarly applied to other embodiments of the semiconductor device, whether described herein or not.

Figure 7:
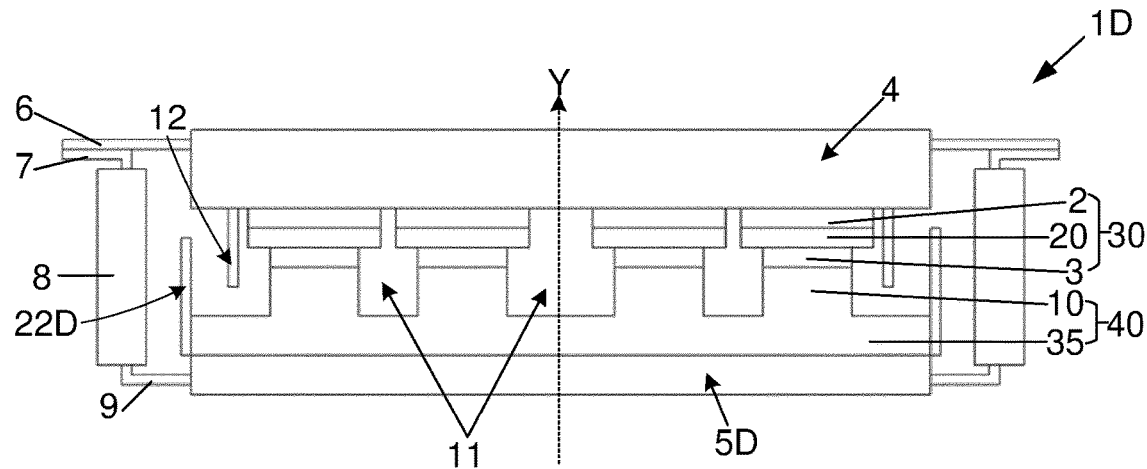
FIG. 7 is a schematic representation of a semiconductor device according to a fifth embodiment of the present disclosure.

With reference to FIG. 7, the device 1D differs from the device 1 in that the lower electrode 5D takes the form of an electrode plate with flat inner and outer surfaces, and an electrically conductive structure 40 is arranged between the lower electrode 5D and the semiconductor units 30. The electrically conductive structure 40 comprises a metal plate 35 and an array of pillars 10 extending between the metal plate 35 and the semiconductor units 30. The array of pillars 10 is integrally formed with the metal plate 35. The second metal explosion shield 22D is fixedly connected to a periphery edge of the metal plate 35, but is identical to the second metal explosion shield 22 otherwise. A dry interface may be formed between the metal plate 35 and the lower electrode 5D. Therefore, the second metal explosion shield 22D is electrically coupled to the lower electrode 5D. In alternative implementations, the second metal explosion shield 22D may be integrally formed with the metal plate 35 and the array of pillars 10, or may be attached to an upper surface of the metal plate 35.

Figure 8:
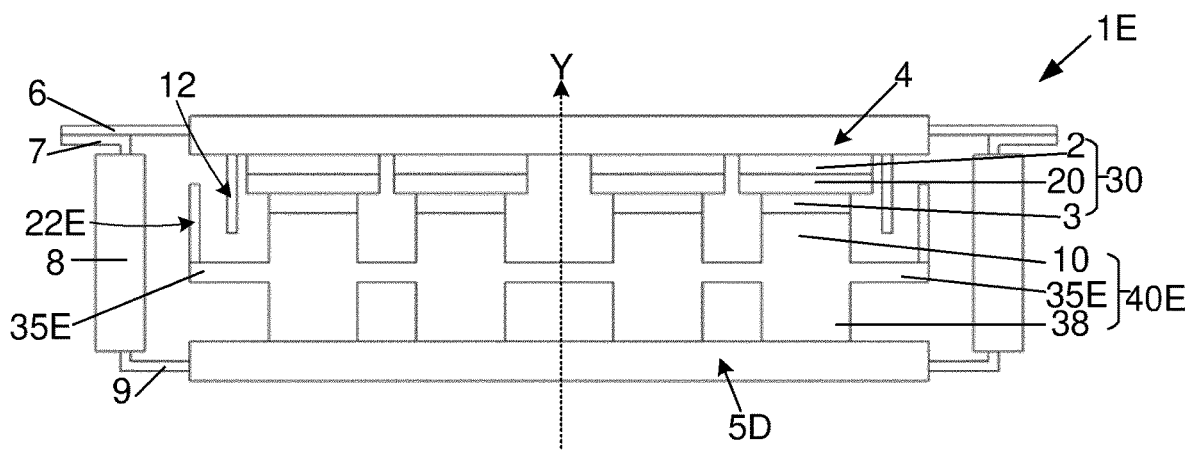
FIG. 8 is a schematic representation of a semiconductor device according to a sixth embodiment of the present disclosure.

With reference to FIG. 8, the device 1E differs from the device 1D in that a different electrically conductive structure 40E is arranged between the lower electrode 5D and the semiconductor units 30. The electrically conductive structure 40E comprises a metal plate 35E, a first array of pillars 10 extending between the metal plate 35E and the semiconductor units 30, and a second array of pillars 38 extending between the metal plate 35E and the lower electrode 5D. The metal plate 35E extends laterally between the pillars 10 (or 38) and may comprise holes at suitable places to allow other elements to pass through. The second metal explosion shield 22E is fixedly connected to an upper surface of the metal plate 35E. A dry interface may be formed between the second array of pillars 38 and the lower electrode 5D. Therefore, the second metal explosion shield 22E is electrically coupled to the lower electrode 5D. In alternative implementations, the second metal explosion shield 22E may be integrally formed with the metal plate 35E, or may be fixedly connected to a periphery edge of the metal plate 35E.

Figure 9:
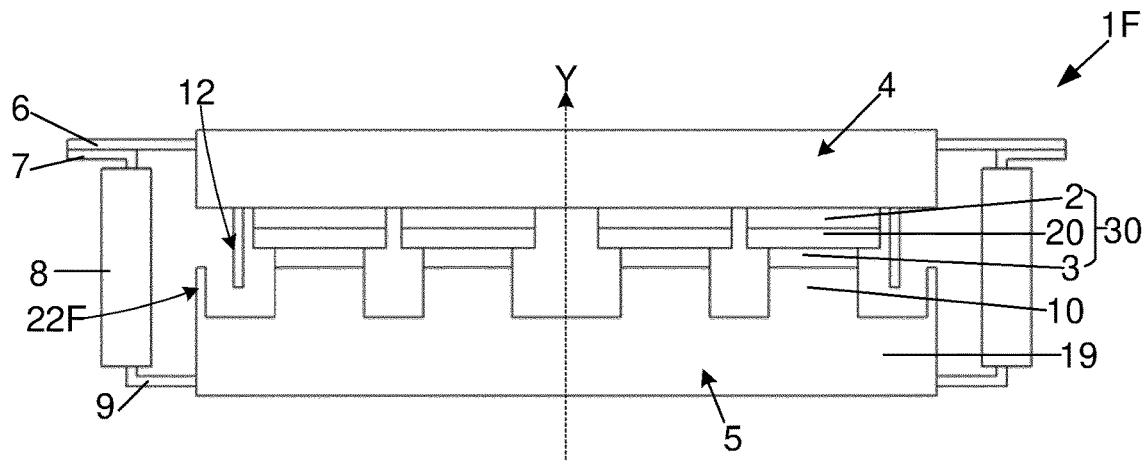
FIG. 9 is a schematic representation of a semiconductor device according to a seventh embodiment of the present disclosure.

With reference to FIG. 9, the device 1F differs from the device 1 in that the second metal explosion shield 22F is integrally formed with the lower electrode 5, but is identical to the second metal explosion shield 22 otherwise.

With reference to FIG. 10, the second metal explosion shield 22 is omitted and the device 1G includes a single metal explosion shield 12. This arrangement may be used when free volume within the device limits the inclusion of a further shield. While the performance of the first metal explosion shield 12 by itself is not as good as using overlapping metal explosion shields 12, 22, the first metal explosion shield 12 is still able to obstruct the majority of pathways of pressure waves and debris ejected by a failed chip 20, so as to protect the inner surfaces of the tubular housing element 8 and the flanges 6, 7 and 9.

In the devices 1 to 1G as shown in FIGS. 2 to 10, housing electrodes 4, 5 (or 5D) are used as a means of applying pressure. Alternatively, a different means of applying pressure, such as a spring mechanism, may be used.

While FIGS. 2 to 10 relate to multi-chip press-pack power semiconductor devices, it would be appreciated that the metal explosion shield(s) may equally be used in the design of any semiconductor device for which explosive rupturing of its hermetic housing is of concern. It would also be understood that such semiconductor device may contain any suitable number of chips therein.

FIG. 11 schematically illustrates processing steps of a method for manufacturing a semiconductor device (e.g., any of the devices 1, 1A-1G).

At step S1, a housing is provided. The housing comprises a first housing electrode and a second housing electrode (e.g., the housing electrodes 4, 5) arranged at opposite sides of the housing, and a tubular housing element (e.g., the tubular housing element 8) arranged between the first and second housing electrodes. The tubular housing element is configured to electrically isolate the first and second housing electrodes from one another.

At step S2, at least one semiconductor chip (e.g., the chips 20) are arranged inside the housing between the first and second housing electrodes.

At step S3, a metal explosion shield (e.g., the shield 12) is arranged within the housing. The metal explosion shield extends into a space formed between the at least one semiconductor chip and the tubular housing element such that the metal explosion shield surrounds the at least one semiconductor chip.

It would be appreciated that the steps may be performed in a temporal order that is different from the order of description. For example, step S1 may comprise two sub-steps, which provide a first part and a second part of the housing, respectively, and steps S2 and S3 may be performed between the two sub-steps such that the at least one semiconductor chip and the separator are arranged within the housing.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The skilled person will understand that in the preceding description and appended claims, positional terms such as 'upper', 'lower', 'top', 'bottom', etc. are made with reference to conceptual illustrations of a semiconductor device, such as those showing standard sectional views and those shown in the appended drawings. These terms are used for ease of reference but are not intended to be of limiting nature. These terms are therefore to be understood as referring to a semiconductor device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A semiconductor device, comprising:
a housing comprising: a first housing electrode and a second housing electrode arranged at opposite sides of the housing, and a tubular housing element arranged between the first and second housing electrodes and configured to electrically isolate the first and second housing electrodes from one another;
at least one semiconductor chip arranged within the housing between the first and second housing electrodes;
a first metal explosion shield arranged within the housing, wherein the first metal explosion shield is configured to extend into a space formed between the at least one semiconductor chip and the tubular housing element such that the first metal explosion shield surrounds the at least one semiconductor chip, wherein the first metal explosion shield comprises first and second opposite ends, and wherein the first end is a fixed end which is electrically coupled to the first housing electrode, and the second end is a free end which is spaced apart from the second housing electrode; and
a second metal explosion shield arranged within the housing and spaced apart from the first metal explosion shield, wherein the second metal explosion shield comprises third and fourth opposite ends, and wherein the third end is a fixed end which is electrically coupled to the second housing electrode, and the fourth end is a free end which is spaced apart from the first housing electrode.

2. A semiconductor device according to claim 1, wherein the at least one semiconductor chip comprises first and second opposing surfaces, which face the first and second housing electrodes, respectively, and wherein the first metal explosion shield is configured to extend beyond each of the first surface and the second surface.

3. A semiconductor device according to claim 1, wherein the first metal explosion shield is spaced apart from the at least one semiconductor chip.

4. A semiconductor device according to claim 1, wherein the first metal explosion shield comprises a metal tube.

5. A semiconductor device according to claim 4, wherein the first metal explosion shield comprises a lip attached to a free end of the metal tube, and the lip extends radially inwards from the free end of the metal tube.

6. A semiconductor device according to claim 1, further comprising a dielectric coating which coats the first metal explosion shield.

7. A semiconductor device according to claim 1, wherein the first metal explosion shield is fixedly connected to the first housing electrode.

8. A semiconductor device according to claim 1, wherein the housing further comprises a first flange connecting the first housing electrode with the tubular housing element, and a second flange connecting the second housing electrode with the tubular housing element.

9. A semiconductor device according to claim 7, wherein the first metal explosion shield is fixedly connected to the first flange.

10. A semiconductor device according to claim 1, further comprising an electrically conductive structure arranged between the at least one semiconductor chip and the first housing electrode, and wherein the electrically conductive structure is electrically coupled to the first housing electrode and the at least one semiconductor chip.

11. A semiconductor device according to claim 10, wherein the first metal explosion shield is fixedly connected to the electrically conductive structure.

12. A semiconductor device according to claim 10, wherein the electrically conductive structure comprises a metal plate arranged between the at least one semiconductor chip and the first housing electrode, and at least one first pillar extending between the metal plate and the at least one semiconductor chip.

13. A semiconductor device according to claim 11, wherein the electrically conductive structure further comprises at least one second pillar extending between the first housing electrode and the metal plate.

14. A semiconductor device according to claim 1, wherein the second metal explosion shield has a greater cross-sectional dimension than the first metal explosion shield along a plane which is perpendicular to an axial direction of the housing.

15. A semiconductor device according to claim 1, wherein the first and second metal explosion shields are concentric.

16. A semiconductor device according to claim 1, wherein the first and second metal explosion shields extend along opposite directions.

17. A semiconductor device according to claim 1, wherein the second metal explosion shield overlaps with the first metal explosion shield along an axial direction of the housing.

18. A semiconductor device according to claim 1, further comprising a third metal explosion shield spaced apart from the second metal explosion shield, wherein the third metal explosion shield has a greater cross-sectional dimension than the second metal explosion shield along a plane which is perpendicular to an axial direction of the housing.

19. A method of manufacturing a semiconductor device, comprising:
    providing a housing, wherein the housing comprises a first housing electrode and a second housing electrode arranged at opposite sides of the housing, and a tubular housing element arranged between the first and second housing electrodes and configured to electrically isolate the first and second housing electrodes from one another;
    arranging at least one semiconductor chip within the housing between the first and second housing electrodes;
    arranging a first metal explosion shield within the housing, wherein the first metal explosion shield extends into a space formed between the at least one semiconductor chip and the tubular housing element such that the first metal explosion shield surrounds the at least one semiconductor chip, wherein the first metal explosion shield comprises first and second opposite ends, and wherein the first end is a fixed end which is electrically coupled to the first housing electrode, and the second end is a free end which is spaced apart from the second housing electrode; and
    arranging a second metal explosion shield within the housing, wherein the second metal explosion shield is spaced apart from the first metal explosion shield, and wherein the second metal explosion shield comprises third and fourth opposite ends, and wherein the third end is a fixed end which is electrically coupled to the second housing electrode, and the fourth end is a free end which is spaced apart from the first housing electrode.

* * * * *